(12) United States Patent
Bang

(10) Patent No.: US 11,153,997 B2
(45) Date of Patent: Oct. 19, 2021

(54) DISPLAY APPARATUS

(71) Applicant: LG Display Co., Ltd., Seoul (KR)

(72) Inventor: Hyo-Jin Bang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/701,523

(22) Filed: Dec. 3, 2019

(65) Prior Publication Data

US 2020/0178425 A1      Jun. 4, 2020

(30) Foreign Application Priority Data

Dec. 3, 2018   (KR) .......................... 10-2018-0153656

(51) Int. Cl.
*H05K 7/20*         (2006.01)
*H05K 1/02*         (2006.01)

(52) U.S. Cl.
CPC ....... *H05K 7/20963* (2013.01); *H05K 1/0284* (2013.01); *H05K 2201/09063* (2013.01)

(58) Field of Classification Search
CPC ............. H05K 7/20963; H05K 1/0284; H05K 2201/09063; H05K 2201/10393; H01L 23/4093; F21S 43/19; G02F 1/133308; G06F 1/1601
See application file for complete search history.

(56) References Cited

U.S. PATENT DOCUMENTS

2006/0289830 A1*   12/2006   Cai .................... H01R 13/639
                                                                252/299.61

\* cited by examiner

*Primary Examiner* — James Wu
*Assistant Examiner* — Hung Q Dang
(74) *Attorney, Agent, or Firm* — Seed IP Law Group LLP

(57) ABSTRACT

A display apparatus including a heat sink plane disposed on a bottom surface of a display panel and configured in such a way that a coupling groove with a circuit board accommodated therein is formed in the guide panel, which is coupled to the bottom surface of a heat sink plane, to attach and detach the circuit board into and from the coupling groove through a guide holder disposed on a guide panel.

9 Claims, 5 Drawing Sheets

DISPLAY APPARATUS

CROSS-REFERENCE TO RELATED APPLICATION

This application claims the benefit of Korean Patent Application No. 10-2018-0153656, filed on Dec. 3, 2018, which is hereby incorporated by reference as if fully set forth herein.

BACKGROUND

Technical Field

The present disclosure relates to a display apparatus, and more particularly, to a display apparatus for detachably coupling a circuit board connected to a display panel to a bottom of the display panel.

Description of the Related Art

An image display for realizing various pieces of information on a screen is core technology of the information communication age and has been developed into a thinner, lighter, and higher-performance image display. Accordingly, a liquid crystal display for receiving light from a light source to realize an image, an organic light-emitting display that intrinsically emits light and thus obviates a light source unit, and the like have drawn attention as flat displays having reduced weight and volume, thus overcoming the disadvantages of cathode ray tubes (CRTs).

Such a display is configured in such a way that a plurality of pixels is arranged in a matrix form to display an image. Here, each pixel includes a light-emitting device and a pixel-driving circuit including a plurality of transistors that independently drive the light-emitting device.

Recently, research has been actively conducted into a thin and light display panel, a display apparatus including a bendable or foldable/unfoldable display panel has been supplied, and a display apparatus having an edge part that is bent to display an image thereon has also been realized.

BRIEF SUMMARY

As a display apparatus becomes lighter and thinner, a circuit board for driving a display panel is disposed, and the circuit board is attached and detached during an assembly process, and in this regard, there is a problem in that a circuit board device may become damaged while the circuit board is attached and detached using double-sided adhesive tape.

Accordingly, the present disclosure is directed to a display apparatus that substantially obviates one or more problems due to limitations and disadvantages of the related art.

In various embodiments, the present disclosure provides a display apparatus for detachably coupling a circuit board to a bottom surface of a display panel through a structure not using double-sided adhesive tape.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display apparatus includes a heat sink plane disposed on a bottom surface of a display panel and configured in such a way that a coupling groove with a circuit board accommodated therein is formed in the guide panel, which is coupled to the bottom surface of a heat sink plane, to attach and detach the circuit board into and from the coupling groove through a guide holder disposed on a guide panel.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
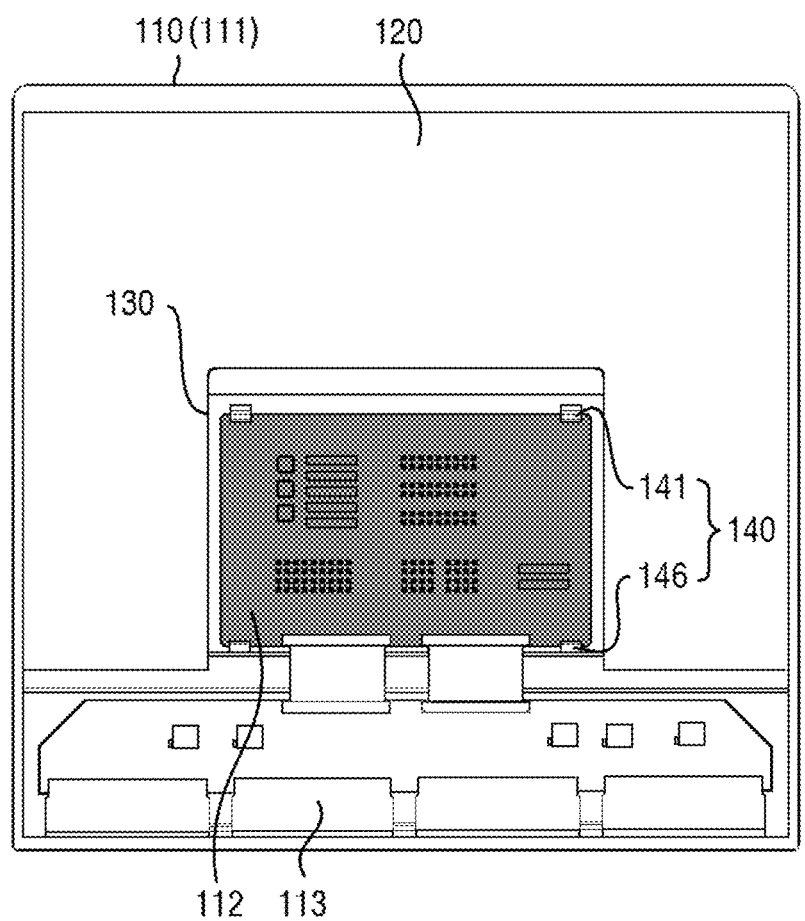
FIG. 1 is a bottom view showing a bottom surface of a display apparatus according to an embodiment of the present disclosure.

Exemplary embodiments of the present disclosure are described in detail so that those of ordinary skill in the art may easily implement the same with reference to the accompanying drawings. Wherever possible, the same reference numbers will be used throughout the drawings to refer to the same or like parts. In addition, a detailed description of known functions and configurations will be omitted when it is determined that the subject matter of the present disclosure may be unnecessarily obscured. Any features shown in the drawings may be exaggerated, reduced, or simplified for ease of description, and the drawings and components shown therein are not always illustrated in proportion. However, those of ordinary skill in the art will easily understand these details.

Figure 2:
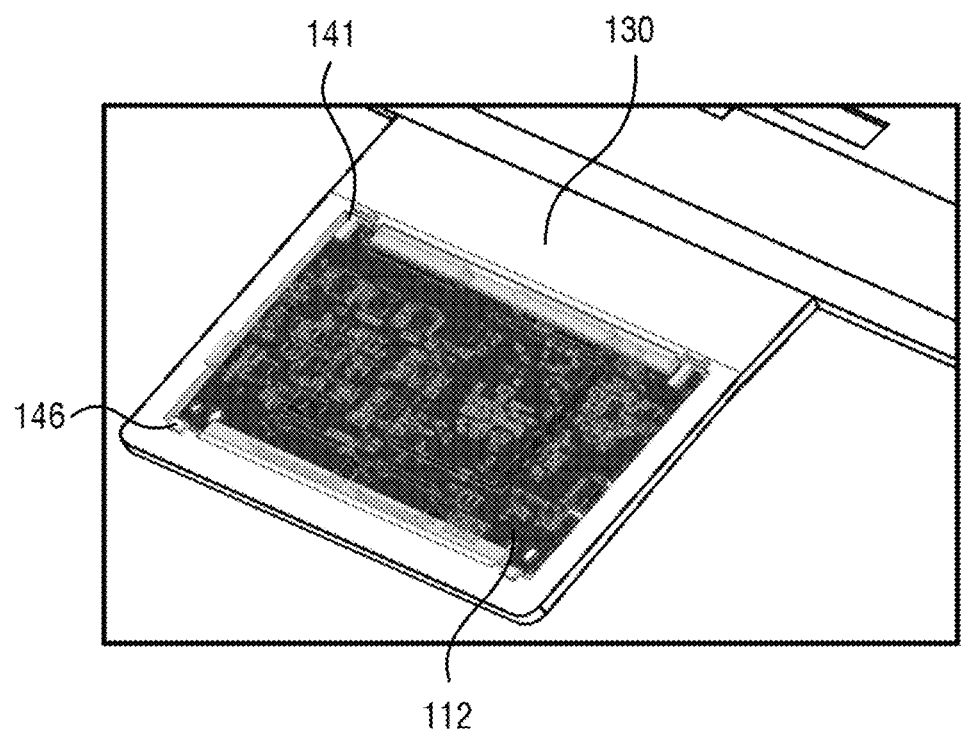
FIG. 2 is a perspective view of a circuit board coupled to a guide panel of the display apparatus shown in FIG. 1 using a guide holder.

FIG. 1 is a bottom view showing a bottom surface of a display apparatus according to an embodiment of the present disclosure. FIG. 2 is a perspective view of a circuit board coupled to a guide panel of the display apparatus shown in FIG. 1 through a guide holder.

Referring to FIGS. 1 and 2, a display apparatus 100 according to the present disclosure may include a display panel 110, a heat sink plane, a guide panel, and a guide holder.

First, the display panel 110 may display an image through a pixel array in which subpixels are arranged in a matrix form. A basic pixel may include at least three subpixels that are capable of expressing white via a color combination of white (W), red (R), green (G), and blue (B) subpixels. For example, the basic pixel may include subpixels of an R/G/B combination, subpixels of a W/R/G combination, subpixels of a B/W/R combination, subpixels of a G/B/W combination, or subpixels of a W/R/G/B combination.

The display apparatus 100 may include a power supply and may generate and output various driving voltages required in a timing controller, a gate driver, a data driver, a display panel, a display apparatus, and the like using an input voltage. For example, the power supply may generate and supply a driving voltage of a digital circuit, which is applied to a data driver and a timing controller, a driving voltage of an analog circuit, which is applied to the data driver, a gate-on voltage (a gate high voltage) and a gate off voltage (a gate low voltage) that are used in the gate driver, and the like. The power supply may generate a plurality of driving voltages EVDD and EVSS, required to drive the display panel, and a reference voltage, and may supply the generated voltages to the display panel 110 through the data driver.

The timing controller may receive image data and basic timing control signals from an external system. The system may be any one of a computer, a television (TV) system, a set-top box, and a system of a portable terminal such as a tablet or a cellular phone. The basic timing control signals may include a dot clock, a data enable signal, a vertical synchronizing signal, a horizontal synchronizing signal, and the like.

The timing controller may generate and supply data control signals and gate control signals that control the driving timing of the data driver and the gate driver, respectively, using the basic timing control signals supplied from the outside and timing setting information (start timing, a pulse width, or the like) stored in an internal register.

The display panel 110 may include a haptic integrated touchscreen, and in this case, the touchscreen may be positioned between a cover glass 111 and the display panel. Here, the display panel may be applied to any of a liquid crystal panel, an organic light-emitting panel, a plasma panel, and the like. The cover glass 111 may be attached to the front surface of the display panel 110, may form the front appearance of the display apparatus, and may simultaneously perform a function of protecting the display panel.

In this case, a cover glass may be disposed on the front surface of the display panel. The cover glass may protect the display panel together with a touchscreen disposed on the front surface of the display panel.

A heat sink 120 (which may be referred to herein as a heat sink panel 120 or a heat sink plane 120) may be attached to a bottom surface of the display panel 110 using double-sided adhesive tape to support the display panel 110, and may perform a function of dissipating the heat generated from the circuit board.

A guide panel 130 may be coupled to a bottom surface of the heat sink plane 120, and the circuit board may be coupled to an inner part of the guide panel 130. Although not shown in the drawing, the heat sink plane and the guide panel may be spaced apart from each other at a predetermined interval, and the guide panel may be detachably coupled to the heat sink plane.

Here, the heat sink plane 120 and the guide panel 130 may be formed of any one of aluminum (Al), magnesium (Mg), silver (Ag), gold (Au), and copper (Cu) or an alloy including a plurality of materials thereamong to increase heat dissipation performance.

When the heat sink plane 120 is attached to the bottom surface of the display panel 110, the guide panel 130 may be coupled to the bottom surface of the heat sink plane 120, and a printed circuit board 112 (hereinafter referred to as the circuit board 112), connected to a flexible printed circuit board 113, which is connected to the display panel 110, may be attached to the bottom surface of the guide panel 130.

At least one iteration of attachment and detachment may be performed on the circuit board 112 during an assembly process. Accordingly, the circuit board 112 may be detachably coupled onto the guide panel 130.

To this end, guide holding elements 140 (which may also be referred to herein as guide holders 140) may be disposed on the guide panel 130 and may be disposed on opposite surfaces of the circuit board 112 so as to face each other.

The guide holders 140 may include a first fixing member 141 (which may be referred to herein as a first fixing part 141), which is disposed on one side surface of a coupling groove 131 of the guide panel 130 to face one side surface of the circuit board 112, and a second fixing member 146 (which may be referred to herein as a second fixing part 146), which is disposed on the other side surface of the coupling groove 131 of the guide panel 130 to face the first fixing part 141 and to correspond to the other side surface of the circuit board 112.

Figure 3:
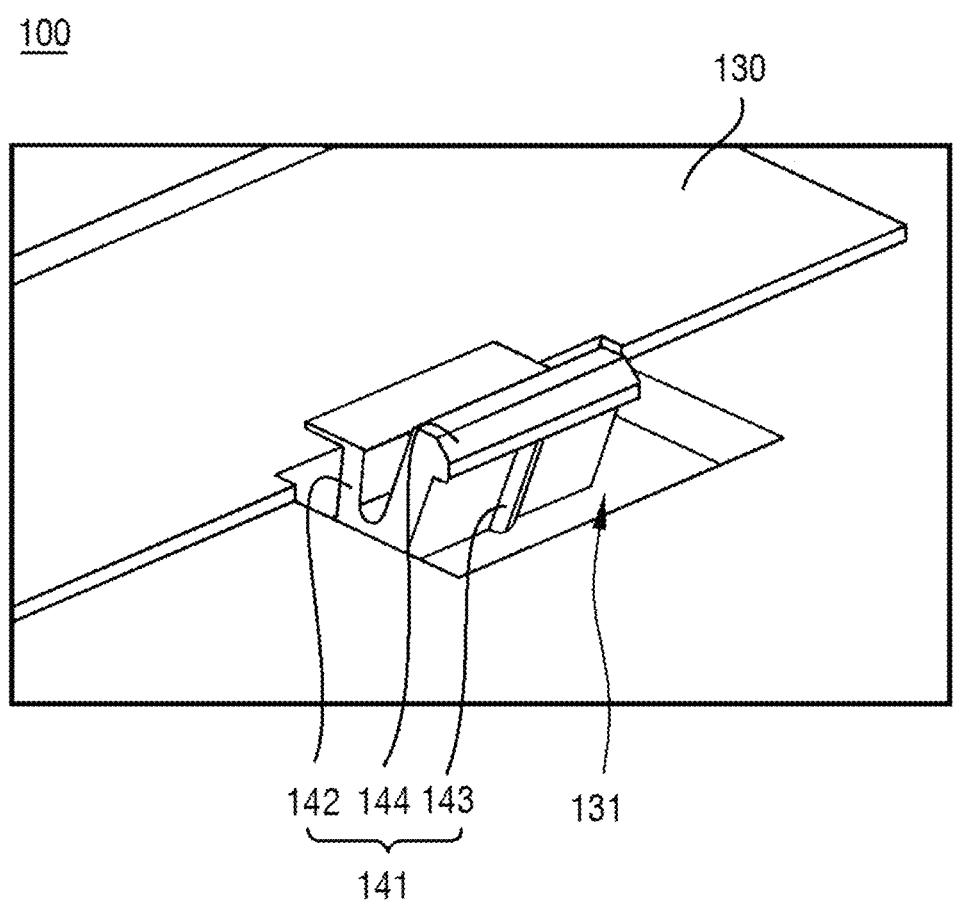
FIG. 3 is a partially enlarged perspective view of a first fixing part of a display apparatus according to a first embodiment of the present disclosure.
Figure 4:
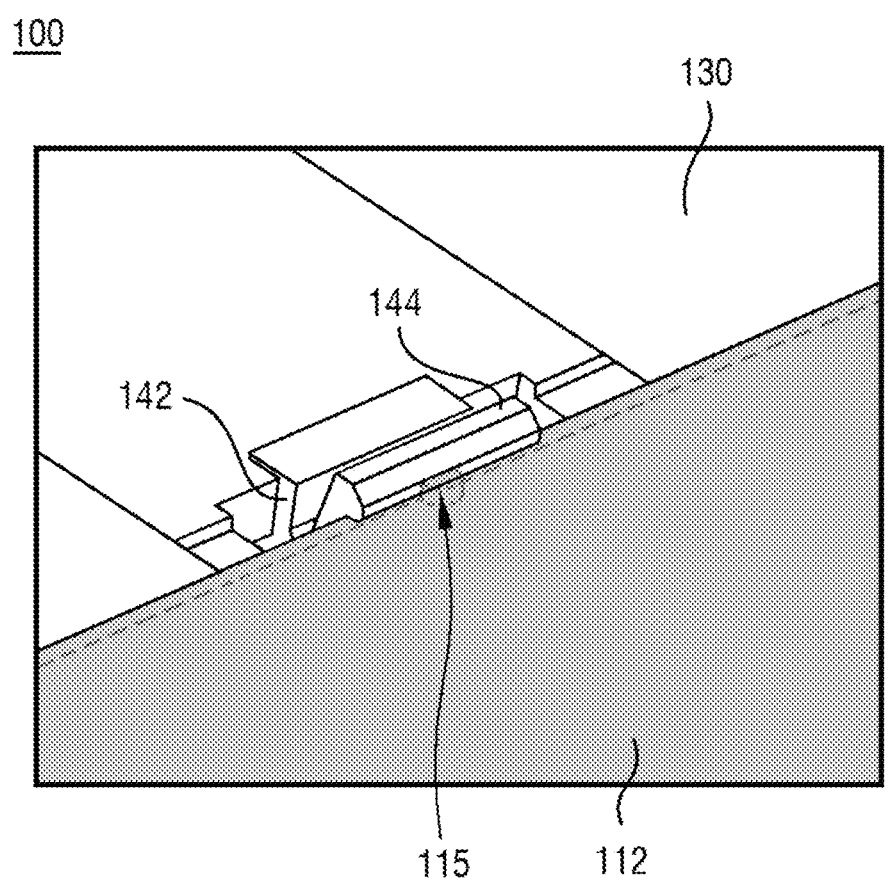
FIG. 4 is a perspective view showing the state in which a circuit board is coupled to a first fixing part of the display apparatus shown in FIG. 3.

FIG. 3 is a partially enlarged perspective view of the first fixing part 141 of a display apparatus according to a first embodiment of the present disclosure. FIG. 4 is a perspective view showing the state in which the circuit board 112 is coupled to the first fixing part 141 of the display apparatus shown in FIG. 3.

Referring to FIGS. 3 and 4, the first fixing part 141 of the display apparatus 100 according to the first embodiment of the present disclosure may include an elastic member 142 disposed on one side surface of the inner circumferential surface of the coupling groove 131 formed on the guide panel 130, and a support member 144 that protrudes from the elastic member 142 and supports an edge portion of one side of the upper surface of the circuit board 112. In an embodiment, the inner circumferential surface is an inner surface that is recessed with respect to the bottom surface of the coupling groove 131.

Here, the first fixing part 141 may be configured to be integrated with the guide panel 130 via injection or may be coupled to the guide panel 130 via separate coupling.

First, the elastic member 142 may have one section having an approximate 'U' or 'V' shape, and may be provided in such a way that opposite facing surfaces are elastically restored.

The support member 144 may be disposed to be integrated with one end of the elastic member 142, and may be fixed by pressing the upper and side surfaces thereof at an edge portion of one side surface of the circuit board 112. Accordingly, the support member 144 may fix the circuit board 112 in a vertical direction and may provide pressing force in a horizontal direction.

In this case, a bottom surface of the circuit board 112 may be disposed to contact an internal lower surface of the coupling groove 131. Although not shown in the drawing, the coupling groove 131 may be configured to penetrate the guide panel 130, or may be configured in a partially penetrating pattern. This may be changed depending on the distance between the heat sink plane and the guide panel 130 or the extent to which the circuit board 112 is heated.

A guide protrusion 143 that protrudes in a direction toward a side surface of an edge portion of the circuit board 112 may be provided below the support member 144 on the elastic member 142.

The guide protrusion 143 may correspond to a position of a guide groove 115 formed in one side surface of the edge portion of the circuit board 112, and the positions of the first fixing part 141 and the circuit board 112 may be set in a horizontal direction while the guide protrusion 143 and the guide groove 115 interfere with each other. Accordingly, the circuit board 112 may be fixed in a horizontal direction through the guide protrusion 143.

Here, the guide protrusion 143 and the support member 144 may be disposed in a perpendicular direction at an end of the elastic member 142.

The first fixing part 141 may press and fix the upper and side surfaces of the circuit board 112 through the support member 144, and the circuit board 112 may be firmly fixed in vertical and horizontal directions while interfering with the side surface of the circuit board 112 through the guide protrusion 143, and simultaneously, a position of the circuit board 112 may be aligned.

Figure 5:
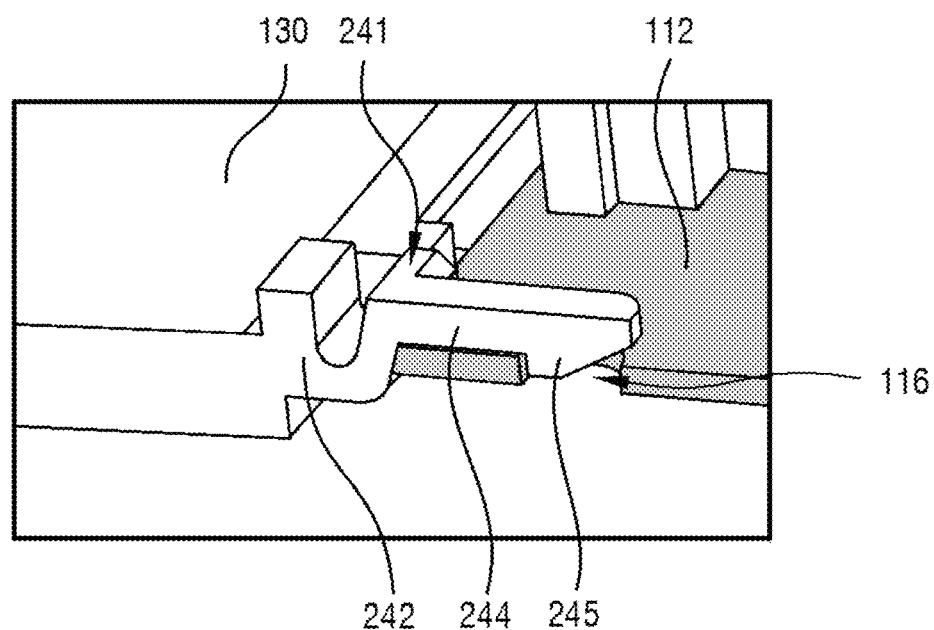
FIG. 5 is a partially enlarged perspective view of a first fixing part of a display apparatus according to a second embodiment of the present disclosure.

FIG. 5 is a partially enlarged perspective view of a first fixing member 241 (which may also be referred to herein as a first fixing part 241) of a display apparatus according to a second embodiment of the present disclosure.

Referring to FIG. 5, the first fixing part 241 of a display apparatus 200 according to the second embodiment of the present disclosure may include an elastic member 242, a support member 244, and a fixing protrusion 245.

The elastic member 242 is the same as the elastic member 142 according to the aforementioned first embodiment, and thus a repeated description thereof will be omitted.

The support member 244 may protrude in a direction toward an upper surface of the circuit board 112 at an end of the elastic member 242, and may press and fix the upper surface of the circuit board 112. In this case, the support member 244 may be formed to a length that is longer than the range in which the elastic member 242 is elastically moveable. That is, even if the elastic member 242 is pressed by external force, the support member 244 may have a predetermined length that is larger than the moveable range of the elastic member 242 in order to prevent one side surface of the circuit board 112 from being decoupled from the support member 244.

The fixing protrusion 245 may be disposed at an end of the support member 244 so as to be inserted into a through hole 116 formed in the circuit board 112. The fixing protrusion 245 may have an inclined surface or a curved surface in the direction in which the circuit board 112 is coupled, and thus coupling of the circuit board 112 may cause relatively low interference, and the fixing protrusion 245 may have a surface positioned in parallel to the internal surface of the through hole 116 in the direction in which the circuit board 112 is decoupled, and thus decoupling of the circuit board 112 causes interference. The fixing protrusion 245 may be inserted at least partway into the through hole 116 to support and fix the circuit board 112, and thus the position of the circuit board 112 may be aligned in a horizontal direction. Needless to say, the support member 244 may also press and fix the upper surface of the circuit board 112 so as to fix the same in a vertical direction.

Figure 6:
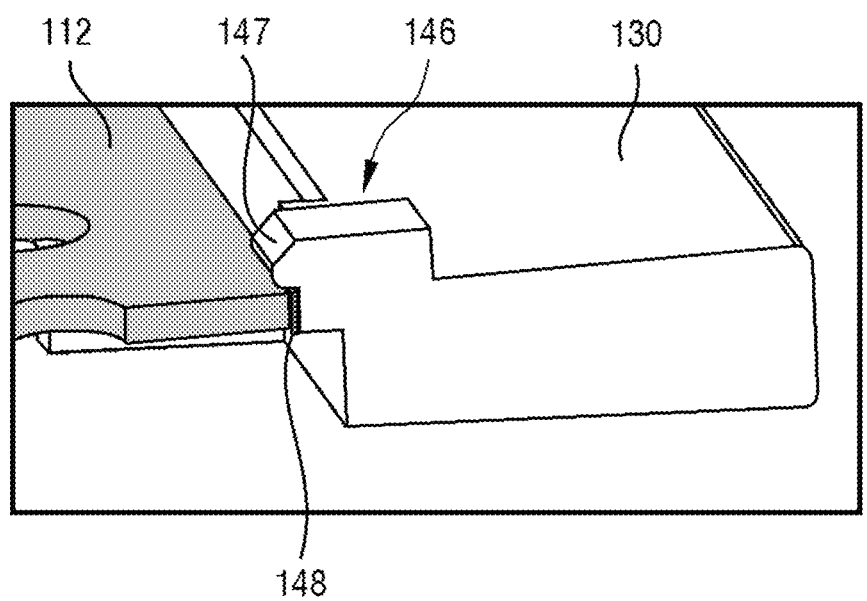
FIG. 6 is a partially enlarged perspective view of a second fixing part of the display apparatus shown in FIG. 1.

FIG. 6 is a partially enlarged perspective view of the second fixing part 146 of the display apparatus shown in FIG. 1.

The second fixing part 146 may fix the other side surface of the edge portion of the circuit board 112. To this end, the second fixing part 146 may include a protrusion 147 (which may also be referred to herein as a step 147) that protrudes toward an upper surface of the other side of the circuit board 112 from the inner circumferential surface of the coupling groove 131. The step 147 may press and support a side surface and the upper surface of the other side of the circuit board 112, and may press and fix the circuit board 112 together with the first fixing parts 141 and 241 disposed at an opposite side.

In this case, the step 147 may have a width that is at least equal to or greater than the range (width or length) in which the elastic member 242 is elastically moveable.

Accordingly, even if the elastic member 242 is pressed by external force, the circuit board 112 may be prevented from being decoupled from the first fixing parts 141 and 241, and the second fixing part 146 and may also be prevented from being decoupled therefrom during delivery. Needless to say, the circuit board 112 has a predetermined elasticity, and thus a user may first decouple the other side surface of the circuit board 112 from the second fixing part 146 while pressing the other side surface, and then one side surface of the circuit board 112 may be easily decoupled from the first fixing parts 141 and 241 while being separated therefrom.

The second fixing part 146 may include an anti-vibration member 148 that is disposed at a contact portion at which at least the second fixing part 146 and the circuit board 112 contact each other below the step 147. Needless to say, although not shown, the anti-vibration member 148 may also be disposed at a portion that contacts a side surface of the circuit board 112 above the first fixing parts 141 and 241.

The anti-vibration member 148 may be formed of a material having a predetermined elasticity in order to prevent the circuit board 112 from being damaged during a process of attaching and detaching the circuit board 112 and to prevent vibration from being transferred between the guide panel 130 and the circuit board 112 during delivery. The anti-vibration member 148 may be formed of a material such as a foam pad, synthetic rubber, or silicon. The anti-vibration member 148 may be disposed around the second fixing part 146, or may be disposed on the entire region in which the circuit board 112 and the guide panel 130 contact each other.

Accordingly, in the display apparatus according to the present disclosure, the guide holder may be disposed on the guide panel, which is disposed on the bottom surface of the display panel, and thus the circuit board may be easily attached and detached, a device disposed on the circuit board may be prevented from being damaged while the circuit board is reassembled after the circuit board is attached and detached from the guide panel, and the circuit board may be stably fixed and supported on the guide panel, thereby achieving an effect of remarkably reducing errors during a delivery process.

In the display apparatus according to the present disclosure, the guide holder may be disposed on the guide panel disposed on the bottom surface of the display panel, and thus the circuit board may be easily attached and detached, a device disposed on the circuit board may be prevented from being damaged while the circuit board is reassembled after the circuit board is attached and detached from the guide panel, and the circuit board may be stably fixed and supported on the guide panel, thereby achieving an effect of remarkably reducing errors during a delivery process.

It will be apparent to those skilled in the art that various modifications and variations can be made in the present disclosure without departing from the spirit or scope of the disclosure. Thus, it is intended that the present disclosure cover such modifications and variations of this disclosure, provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus comprising:
   a display panel including a bottom surface;
   a heat sink coupled to the bottom surface of the display panel;
   a guide panel coupled to the heat sink, the guide panel including a bottom surface and an edge;
   a coupling groove in the bottom surface of the guide panel;
   a circuit board connected to the display panel and the circuit board including a first edge and a second edge; and
   a plurality of guide holding elements disposed at the edge of the guide panel, the plurality of guide holding elements detachably coupled to the circuit board, the plurality of guide holding elements including:
      a first fixing member configured to fix the first edge of the circuit board; and
      a second fixing member disposed to face the first fixing member and configured to fix the second edge of the circuit board.

2. The display apparatus of claim 1, wherein the coupling groove includes an inner surface that is recessed with respect to the bottom surface of the guide panel, the first fixing member including:
   an elastic member disposed in the coupling groove and facing the first edge of the circuit board; and
   a support member protruding from the elastic member and configured to fix the first edge of the circuit board in a vertical direction.

3. The display apparatus of claim 2, wherein the first edge of the circuit board includes a guide groove and the first fixing member includes a guide protrusion protruding from the elastic member, the guide groove sized and shaped to receive the guide protrusion to fix the first edge of the circuit board in a horizontal direction.

4. The display apparatus of claim 3, wherein the support member and the guide protrusion are disposed on the elastic member perpendicular relative to the elastic member.

5. The display apparatus of claim 2, wherein the elastic member is integrated with the guide panel and includes a section having a "U" or a "V" shape.

6. The display apparatus of claim 1, wherein the first fixing member includes:
   an elastic member disposed in the groove in a direction toward an upper surface of the circuit board;
   a support member elastically coupled to the elastic member and configured to contact the upper surface of the circuit board, the support member having an end; and
   a fixing protrusion extending from the end from the support member and sized and shaped to be received in a through hole through the circuit board.

7. The display apparatus of claim 1, wherein the second fixing member includes a protrusion extending from the coupling groove toward the second edge of the circuit board.

8. The display apparatus of claim 7, wherein the protrusion has a width and the elastic member has a range of motion, the width of the protrusion equal to or greater than the range of motion of the elastic member.

9. The display apparatus of claim 7, wherein the second fixing member includes an anti-vibration member disposed below the protrusion of the second fixing member in a region that contacts the circuit board.

* * * * *